(12) United States Patent
Enomoto et al.

(10) Patent No.: US 7,721,427 B2
(45) Date of Patent: May 25, 2010

(54) METHOD FOR MANUFACTURING SINGLE SIDED SUBSTRATE

(75) Inventors: Ryo Enomoto, Gihu (JP); Yasuji Hiramatsu, Gihu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 1060 days.

(21) Appl. No.: 11/244,728

(22) Filed: Oct. 6, 2005

(65) Prior Publication Data
US 2006/0037193 A1 Feb. 23, 2006

Related U.S. Application Data

(62) Division of application No. 10/358,933, filed on Feb. 5, 2003, now abandoned, and a division of application No. 09/453,636, filed as application No. PCT/JP98/02498 on Jun. 5, 1998, now Pat. No. 6,518,513.

(30) Foreign Application Priority Data

Jun. 6, 1997 (JP) .................... 9-165291

(51) Int. Cl.
*H01K 3/10* (2006.01)
(52) U.S. Cl. .............. 29/852; 29/825; 29/830; 29/846
(58) Field of Classification Search ............ 29/825, 29/846, 852, 830
See application file for complete search history.

(56) References Cited

U.S. PATENT DOCUMENTS 5,046,238 A * 9/1991 Daigle et al. ............ 29/830

(Continued)

FOREIGN PATENT DOCUMENTS

JP 62244156 A 10/1987

(Continued)

OTHER PUBLICATIONS

Communication of May 12, 2004, Supplementary European Search Report and Annex to the European Search Report on European Patent Application No. EP 98923141.

(Continued)

*Primary Examiner*—C. J Arbes
(74) *Attorney, Agent, or Firm*—Oblon, Spivak, McClelland, Maier & Neustadt, L.L.P.

(57) ABSTRACT

Holes (40*a*) are formed with a laser beam through an insulating substrate (40) on which a metallic layer (42) is formed and via holes (36*a*) are formed by filling up the holes (40*a*) with a metal (46). After the via holes (36*a*) are formed, a conductor circuit (32*a*) is formed by etching the metallic layer (42) and a single-sided circuit board (30A) is formed by forming projecting conductors (38*a*) on the surfaces of the via holes (36*a*). The projecting conductors (38*a*) on the circuit board (30A) are put on the conductor circuit (32*b*) of another single-sided circuit board (30B) with adhesive layers (50) composed of an uncured resin in-between and heated and pressed against the circuit (32*b*). The projecting conductors (38*a*) get in the uncured resin by pushing aside the resin and are electrically connected to the circuit (32*b*). Since single-sided circuit boards (30A, 30B, 30C, and 30D) can be inspected for defective parts before the boards (30A, 30B, 30C, and 30D) are laminated upon one another, only defectless single-sided circuit can be used in the step of lamination.

13 Claims, 9 Drawing Sheets

U.S. PATENT DOCUMENTS

| | | | |
|---|---|---|---|
| 5,291,062 A | 3/1994 | Higgins, III | |
| 5,309,629 A | 5/1994 | Traskos et al. | |
| 5,329,423 A | 7/1994 | Scholz | |
| 5,346,750 A | 9/1994 | Hatakeyama et al. | |
| 5,361,491 A | 11/1994 | Oomachi et al. | |
| 5,367,435 A | 11/1994 | Andros et al. | |
| 5,374,469 A | 12/1994 | Hino et al. | |
| 5,401,913 A * | 3/1995 | Gerber et al. | 174/264 |
| 5,457,881 A | 10/1995 | Schmidt | |
| 5,601,678 A * | 2/1997 | Gerber et al. | 156/150 |
| 5,744,758 A * | 4/1998 | Takenouchi et al. | 174/255 |
| 5,764,485 A | 6/1998 | Lebaschi | |
| 5,879,787 A * | 3/1999 | Petefish | 428/209 |
| 5,888,627 A | 3/1999 | Nakatani | |
| 5,939,789 A * | 8/1999 | Kawai et al. | 257/758 |
| 6,037,044 A | 3/2000 | Giri et al. | |
| 6,163,957 A * | 12/2000 | Jiang et al. | 29/852 |
| 6,320,140 B1 * | 11/2001 | Enomoto | 174/264 |
| 6,440,542 B1 * | 8/2002 | Kariya | 428/209 |
| 6,518,513 B1 * | 2/2003 | Enomoto et al. | 174/262 |
| 6,586,686 B1 * | 7/2003 | Enomoto et al. | 174/262 |
| 2003/0141108 A1 * | 7/2003 | Enomoto et al. | 174/262 |

FOREIGN PATENT DOCUMENTS

| | | |
|---|---|---|
| JP | 2-254790 | 10/1990 |
| JP | 02265294 A | 10/1990 |
| JP | 03145791 A | 6/1991 |
| JP | 4-94186 | 3/1992 |
| JP | 04162589 | 6/1992 |
| JP | 06045722 A | 2/1994 |
| JP | 06326438 | 11/1994 |
| JP | 07-014628 A | 1/1995 |
| JP | 07014942 A | 1/1995 |
| JP | 07-106756 A | 4/1995 |
| JP | 07-231167 A | 8/1995 |
| JP | 07240582 | 9/1995 |
| JP | 7-263828 | 10/1995 |
| JP | 07007264 A | 10/1995 |
| JP | 08-148828 A | 6/1996 |
| JP | 08-172270 A | 7/1996 |
| JP | 08213748 A | 8/1996 |
| JP | 08279678 A | 10/1996 |
| JP | 08-288649 A | 11/1996 |
| JP | 8-510868 | 11/1996 |
| JP | 09 116273 | 5/1997 |
| JP | 09130038 A | 5/1997 |
| JP | 10117067 | 5/1998 |
| WO | WO94/29897 | 12/1994 |
| WO | WO97/48260 | * 12/1997 |

OTHER PUBLICATIONS

Publication: The 9$^{th}$ National Convention Record JIPC, Mar. 1995, Tokyo, ISSN 0916-0043; Section 3: Manufacturing Process; Section 4: Pulse Oscillation type $CO_2$ Laser; Section 5: Substrate Material; Section 6: Conductive Paste; Section 7: Properties; Section 7-2: Multilayered Substrate Properties; Section 8: Merits of All-layer IVH Resin Multilayered Substrate "ALIVH". An English translation of the preceding is enclosed for the Examiner's consideration.

* cited by examiner

METHOD FOR MANUFACTURING SINGLE SIDED SUBSTRATE

BACKGROUND OF THE INVENTION

1. Field of the Invention

The present invention relates to a single-sided circuit board and a manufacturing method therefor, and more particularly to a single-sided circuit board used for manufacture of a multilayer printed circuit board having an interstitial via hole (IVH) structure and a manufacturing method therefor.

2. Description of the Related Art

A conventional multilayer printed circuit board is constituted by a laminate obtained by alternately laminating copper-clad laminates and prepregs. The laminate has a surface on which a surface wiring pattern has been formed. Moreover, an internal wiring pattern is formed between interlayer insulating layers. Through holes are, by punching formed in the direction of the thickness of the laminate to establish the electric connections among internal wiring patterns or among internal wiring patterns and the surface wiring patterns.

The multilayer printed circuit board having the above-mentioned through hole structure must have regions for forming the through holes. Therefore, the density at which elements are mounted cannot be easily raised. As a result, there arises a problem in that the multilayer printed circuit board having the through hole structure cannot easily address needs for considerable reductions in the sizes of the portable electronic apparatuses, realizing narrow pitch packages and practical use of MCM.

As an alternative to the foregoing multilayer printed circuit board having the through hole structure, a multilayer printed circuit board has recently received attention which is formed into a full-thickness interstitial via-hole (IVH) structure which is able to easily address raising of the density.

The multilayer printed circuit board having the full-thickness IVH structure is a printed circuit board having a structure in which via holes for electrically connecting conductive layers to one another are formed in each of the interlayer insulating layers which constitute the laminate. That is, the foregoing printed circuit board has the via holes (buried via holes or blind via holes) which do not penetrate the substrate on which the circuit is formed and which electrically connect the internal wiring patterns to one another or the internal wiring patterns and the surface wiring patterns to one another. Therefore, the multilayer printed circuit board having the IVH structure is free from a necessity of specially forming regions for forming the through holes. Therefore, arbitrary layers can freely be connected to one another through small via holes. As a result, size reduction, high density and high-speed propagation of signals can be easily realized.

The multilayer printed circuit board having the IVH structure is manufactured by a process arranged, for example, as shown in FIG. 6.

Initially, a material having a structure in which an aramide nonwoven fabric cloth is impregnated with epoxy resin is employed as prepreg 112. Then, an operation for forming holes in the prepreg 112 is performed by using carbon dioxide gas laser. Then, conductive paste 114 is enclosed in obtained hole portions 112a (see FIG. 6(A)).

Then, copper foil 116 is laminated on each of the two sides of the prepreg 112, and then heat and pressure are applied to the prepreg 112 having the copper foil 116 by heat pressing. Hence it follows that the epoxy resin and the conductive paste of the prepreg 112 are hardened so that the electrical connection between the two copper foil members 116 on the two sides of the prepreg 112 is established (see FIG. 6(B)).

Then, the copper foil 116 on each side is patterned by an etching method so that a hard and double-sided substrate having via holes is obtained (see FIG. 6(C)).

Then, the obtained double-sided substrates are used as core layers to form a multilayer structure. Specifically, the prepreg and copper foil are sequentially laminated on the two sides of the foregoing core layer while the prepreg and the copper foil are being aligned. Then, heat pressing is again performed, and then the uppermost copper foil 116 is etched. Thus, a four-layer substrate is obtained (see FIGS. 6(D) and 6(E)). When a structure having a large number of layers is formed, the foregoing process is repeated. Thus, a six-layer substrate or an eight-layer substrate can be obtained.

The foregoing conventional technique, however, must repeat the laminating process using heat pressing and the process for patterning the copper foil by performing the etching operation. Therefore, the manufacturing process becomes too complicated and considerable time is required to complete the manufacturing operation.

If the multilayer printed circuit board having the IVH structure which can be obtained by the above-mentioned manufacturing method encounters only one defective portion (only one defective process) in the patterning operation during the manufacturing process, the overall circuit board, which is the final product, becomes a defective product Hence it follows that the manufacturing yield deteriorates excessively.

To overcome the above-mentioned problems, an object of the present invention is to provide a high-density multilayer printed circuit board having the IVH structure which can be efficiently manufactured and which permits a satisfactory high manufacturing yield.

DISCLOSURE OF THE INVENTION

To achieve the above-mentioned object, a single-sided circuit board in the present invention is structured as follows. A single-sided circuit board according to the present invention is characterized in that an insulating base member on either side of which a conductive circuit is formed, wherein said insulating base member has non-penetrating holes which reach said conductive circuit, via holes are formed by enclosing electrolytic plating in said non-penetrating holes, projecting conductors made of conductive paste or metal having a low melting point are formed on the surfaces of said via holes formed on the surface of said insulating base member opposite to the surface on which said conductive circuit has been formed.

In accordance with the more preferred teaching of the present invention, said non-penetrating holes are characterized by being completely filled with electrolytic plating.

In accordance with the more preferred teaching of the present invention, said non-penetrating holes are characterized by being filled with the electrolytic plating to an average depth of 50% or higher of the depth of said non-penetrating holes and lower than 100% of the same.

In accordance with the more preferred teaching of the present invention, said insulating base member is characterized as an organic insulating member.

In accordance with the more preferred teaching of the present invention, said electrolytic plating is characterized as copper electrolytic plating.

In accordance with the more preferred teaching of the present invention, said insulating member is characterized as a single-sided copper-clad laminate.

A method of manufacturing a single-sided circuit board according to the present invention is characterized by at least comprising the steps (1) to (4):

(1) forming non-penetrating holes which reach a metal layer by a laser process in a insulating base member having said metal layer formed on either side thereof;

(2) enclosing electrolytic plating into said non-penetrating holes formed in step (1) to form via holes;

(3) forming a conductive circuit by etching said metal layer; and (4) forming projecting conductors made of conductive paste or metal having a low melting point on the surfaces of said via holes formed on the surface of said insulating base member to the surface on which said conductive circuit has been formed so that a single-sided circuit board is obtained.

A method of manufacturing a single-sided circuit board according to the present invention is characterized by at least comprising the steps (1) to (3):

(1) forming non-penetrating holes which reach a metal layer by a laser process in a insulating base member having said metal layer formed on either side thereof;

(2) enclosing electrolytic plating into said non-penetrating holes formed in step (1) to form via holes and forming projecting conductors made of conductive paste or metal having a low melting point on the surfaces of said via holes formed on the surface of said insulating base member opposite to the surface on which said conductive circuit has been formed; and (3) etching metal layer to form a conductive circuit so that a single-sided circuit board is obtained.

A method of manufacturing a single-sided circuit board in accordance with the more preferred teaching of the present invention is characterized in that said step (1) is performed such that a film is bonded to insulating base member having the metal layer formed on either side thereof and non-penetrating holes which penetrate said film and said insulating base member to reach said metal layer are formed by a laser process.

A method of manufacturing a single-sided circuit board in accordance with the more preferred teaching of the present invention is characterized in that said insulating base member is an organic insulating base member.

A method of manufacturing a single-sided circuit board in accordance with the more preferred teaching of the present invention is characterized in that said insulating base member is a single-sided copper cladding laminate.

A method of manufacturing a single-sided circuit board in accordance with the more preferred teaching of the present invention is characterized in that said electrolytic plating is copper electrolytic plating.

A method of manufacturing a single-sided circuit board in accordance with the more preferred teaching of the present invention is characterized in that said projecting conductors are formed by printing conductive paste.

A method of manufacturing a single-sided circuit board in accordance with the more preferred teaching of the present invention is characterized in that said projecting conductors are formed by printing metal paste having a low melting point, plating of metal having a low melting point or immersion of metal having a low melting point into molten solution.

The single-sided circuit board according to the present invention is arranged such that the single-sided circuit boards each having a conductive circuit which incorporates a predetermined wiring pattern formed thereon are previously and individually manufactured.

These single-sided circuit boards are laminated to other substrates through an adhesive layer and are integrated by the heat pressing. Therefore, inspection for detecting whether or not the conductive circuit or the like has a defective portion can be performed before the single-sided circuit boards are laminated. Hence it follows that only single-sided circuit boards free from any defect can be used in the laminating process. That is, the manufacturing method is able to reduce defects in the manufacturing process. As a result, the multilayer printed circuit board having the IVH structure can be manufactured with a high manufacturing yield.

The method of manufacturing a multilayer printed circuit board having the IVH structure used the single-sided circuit board according to the present invention is not required to repeat the heating press operation while the prepreg is being laminated as distinct from the conventional technique. That is, the present invention enables the heat pressing operation to be completed at a time such that a plurality of the single-sided circuit boards are laminated through the adhesive agents placed on the single-sided circuit boards. Therefore, the manufacturing method according to the present invention is free from a necessity for repeating the laminating process, in which the complicated heat press is performed, and the patterning process. Hence it follows that the multilayer printed circuit board having the IVH structure can efficiently be manufactured.

In the present invention, formation of the non-penetrating holes in the organic insulating substrate is performed by laser machining. The structure of the present invention is able to eliminate the necessity of forming holes in the organic adhesive agent, an organic insulating substrate and an adhesive agent by performing a laser process. That is, after holes have been formed in the organic insulating substrate by performing the laser process, the organic adhesive layer can be formed on the single-sided circuit substrate or the substrate having the conductor circuit.

That is, the single-sided circuit board according to the present invention is structured such that the projecting conductors inserted into the organic adhesive layer during the heat pressing establish the connection of the conductor circuits. Therefore, previous formation of the conducting hole in the organic adhesive layer is not required. The organic adhesive layer may be formed at the final heat pressing process. As a result, the desmear process, which is performed after the hole has been formed, may be performed before the formation of the organic adhesive layer. Hence it follows that the desmear process does not erode the adhesive layer.

Also, the adhesive layer can be formed on the single-sided circuit board or the substrate having the conductive circuit after the non-penetrating hole has been formed in the insulating base member by performing the laser process and the non-penetrating hole has been filled with the electrolytic plating. Therefore, the electrolytic plating solution and the adhesive layer are not made contact with each other. As a result, the erosion and contamination of the adhesive layer with the plating solution can be prevented.

Since the adhesive layer is not hardened until the heat pressing process which is the final process is performed, the organic adhesive layer easily deteriorates owing to the desmear process and the plating solution. The present invention is characterized in that the foregoing problem can be prevented and a reliable substrate can be easily formed.

Furthermore, projecting conductors made of conductive paste or metal having a low melting point are formed on the surfaces of via holes formed on the surface of said insulating base member opposite to the surface on which conductive circuit has been formed. Therefore, since conductive paste or metal having a low melting point is deformed during the heat pressing and uneven height of the electric plating can be absorbed, the multilayer printed circuit board, whereby the defective connection can be prevented which is highly reliable in connection, is obtained.

Moreover, according to the single-sided circuit board of the present invention, a necessity for previously forming a conducting hole in the adhesive layer can be eliminated. Therefore, defective conduction caused from deviation in the positions of the hole in the adhesive layer and the projecting conductors provided for the organic insulating base member can be prevented.

In the single-sided circuit board according to the present invention, the projecting conductors are formed on the via holes filled with the electrolytic plating. Therefore, electrical connection between the upper and lower conductive layers in the multilayer printed circuit substrate can be easily established by penetrating the relatively thin organic adhesive layer. Therefore, the height and the diameter of each projecting conductor can be reduced. Hence it follows that the pitch between adjacent projecting conductors can be shortened. Therefore, the pitch between adjacent via holes can also be shortened. As a result, addressing to the raising of the density can be permitted. Since the via holes are filled with the electrolytic plating, the resistance value between the upper and the lower conductor layers can be lowered.

Techniques for connecting the upper and lower conductors to each other by penetrating the resin insulating layer of the multilayer printed circuit board have been disclosed in Japanese Patent Laid-Open No. 7-14628, Japanese Patent Laid-Open No. 7-106756, Japanese Patent Laid-Open No. 7-231167, Japanese Patent Laid-Open No. 8-172270 and Japanese Patent Laid-Open No. 8-288649. The foregoing techniques are different from the technique with which the projecting conductors are formed on the via holes filled with the electrolytic plating. Therefore, the effect of the present invention cannot be obtained.

BEST MODE FOR CARRYING OUT THE INVENTION

A single-sided circuit board and a multilayer printed circuit board and a manufacturing method therefor used single-sided circuit board according to an embodiment of the present invention will now be described with reference to the drawings.

Figure 1:
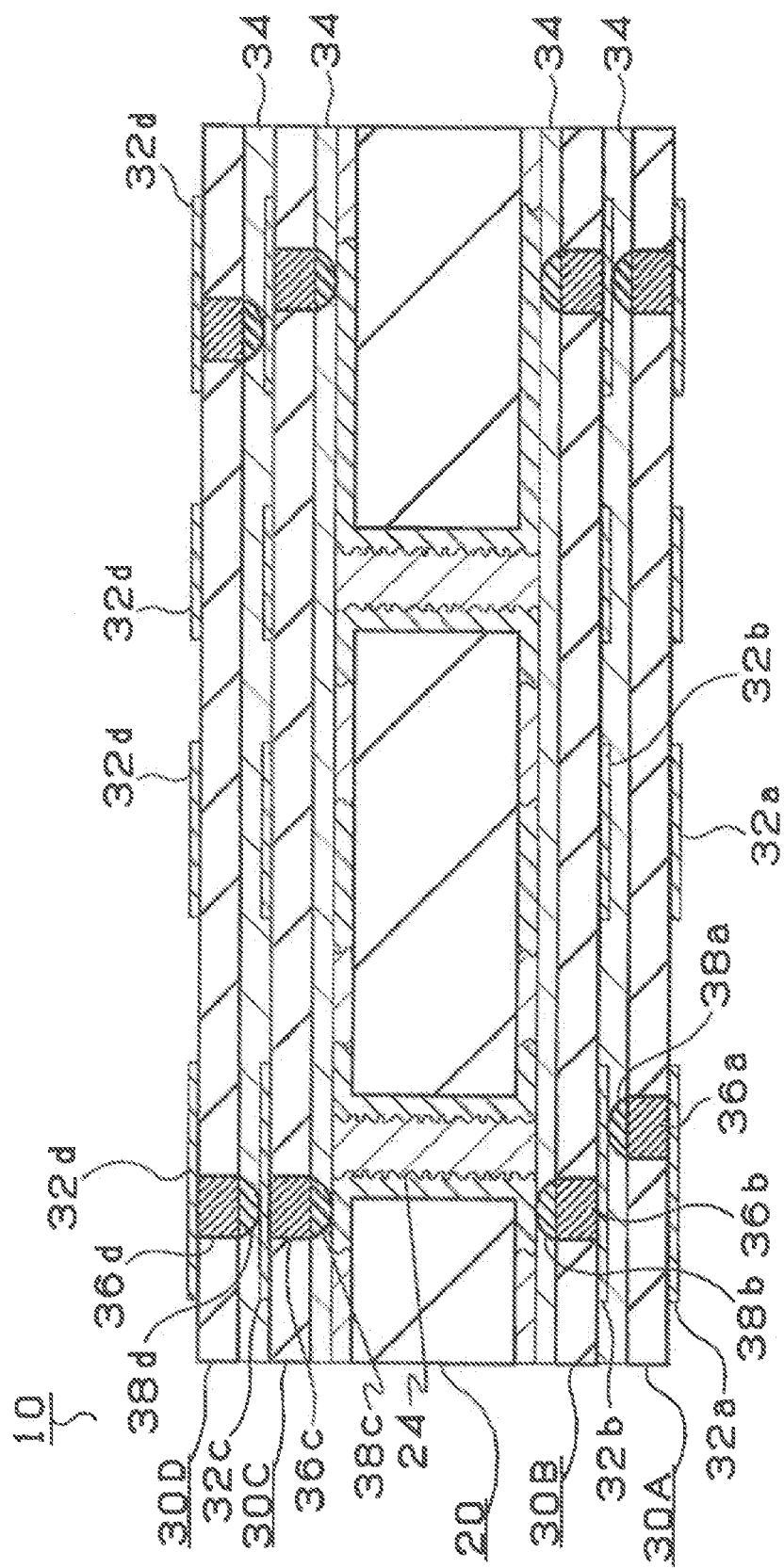
FIG. 1 is a vertical cross sectional view showing a multilayer printed circuit board according to an embodiment of the present invention.

FIG. 1 shows a vertical cross section of a multilayer printed circuit board having a full-thickness IVH structure. A multilayer printed circuit board 10 is a multilayer printed circuit board incorporating a core substrate 20 disposed in a central portion of the multilayer printed circuit board 10 and single-sided circuit boards 30A, 30B, 30C and 30D of the present invention, two substrates of which are formed on the upper surface of the core substrate 20 and the lower surface of the same, respectively.

Conductive circuits 32a, 32b, 32c and 32d each having a predetermined pattern are formed on the surfaces of the corresponding single-sided circuit boards 30A, 30B, 30C and 30D. Adhesive layers 34 are formed on other surfaces of the same. The core substrate 20 and the single-sided circuit boards 30A, 30B, 30C and 30D are bonded to one another through the adhesive layers 34. The single-sided circuit boards 30A, 30B, 30C and 30D have corresponding via holes 36a, 36b, 36c and 36d formed by enclosing electrolytic copper plating. Projecting conductors (hereinafter called "bumps") 38a, 38b, 38c and 38d made of metal, such as solder or an indium alloy or conductive paste, are formed on the foregoing via holes (the surfaces of the via holes opposite to the surfaces on which the conductive circuits are formed).

That is, in the multilayer printed circuit board 10, a conductive circuit 32a of the lowermost single-sided circuit board 30A is connected to a bump 38a through the via hole 36a. The bump 38a is made to contact with a conductive circuit 32b of the single-sided circuit board 30B to establish the connection between the two circuits. The bump 38b connected to the conductive circuit 32b through the via hole 36b is made to contact with the through hole 24 (a via hole is made after multilayer structure is formed) of the core substrate 20 so that conduction is realized. The through hole 24 of the core substrate 20 is connected to the bump 38c of the upper single-sided circuit board 30C. The conductive circuit 32c connected to the bump 38c through the via hole 36c is connected to the bump 38d of the uppermost single-sided circuit board 30D. The bump 38d is connected to the conductive circuit 32d through the via hole 36d. An electronic element, such as a bear chip, can be mounted on either surface or two surfaces of the uppermost single-sided circuit board 30D. Thus, the conductive circuit 32a of the lowermost single-sided circuit board 30A of the multilayer printed circuit board and the chip element (not shown) mounted on the conductive circuit 32 of the uppermost single-sided circuit board 30D are connected to each other through the via holes 36a, 36b, 36c and 36d. The foregoing via holes constitute interstitial via holes.

The method of manufacturing the multilayer printed circuit board 10 using single-sided circuit board according to the present invention will now be continued. A method of manufacturing the core substrate 20 will now be described with reference to FIG. 2.

The core substrate may be a known rigid substrate, such as an epoxy resin substrate having a glass cloth base member or a BT (Bismaleimide-Triazine) resin substrate having a glass cloth base member.

Figure 2:
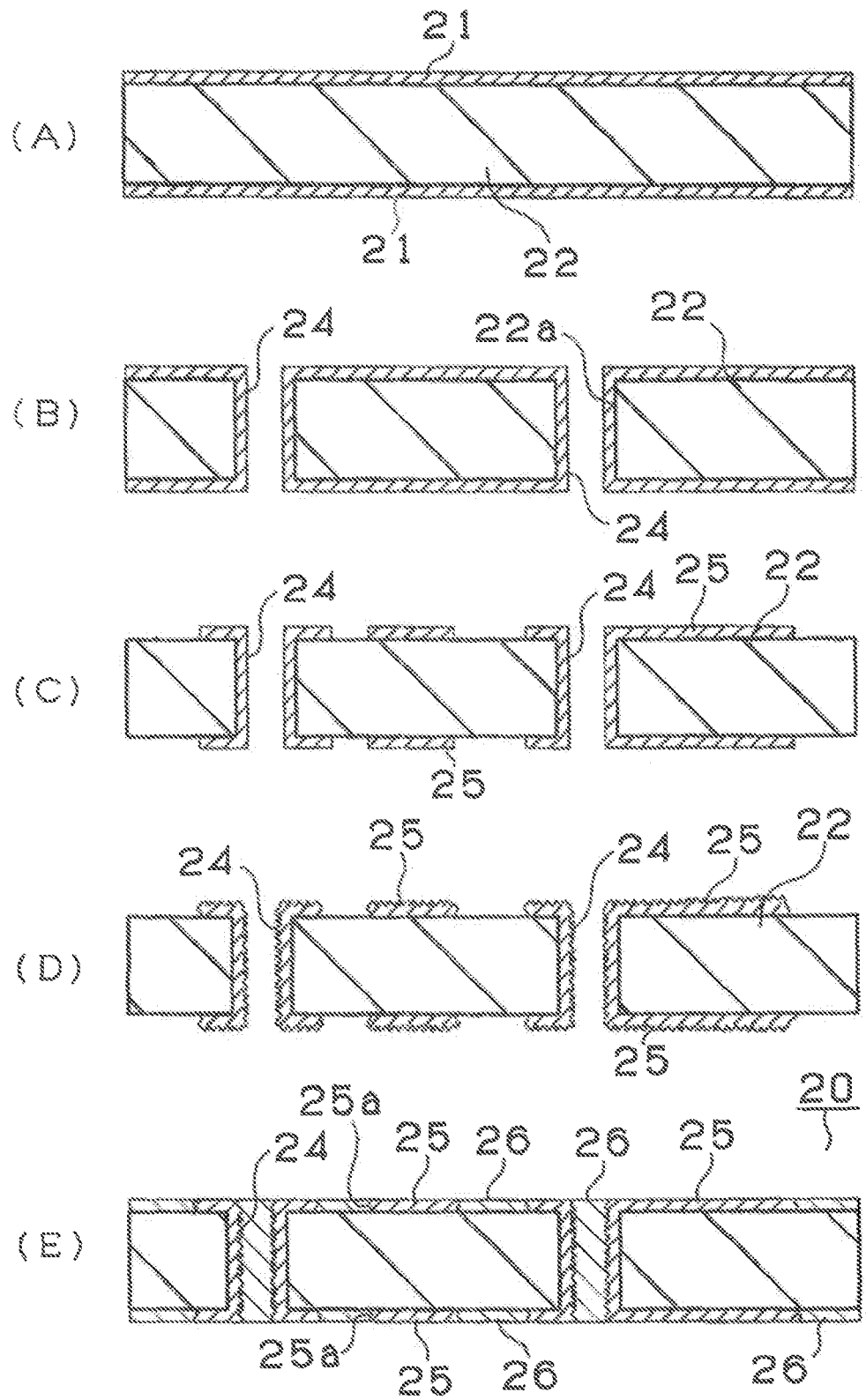
FIG. 2 is a diagram showing a process for manufacturing a core substrate which constitutes the multilayer printed circuit board according to the embodiment of the present invention.

Specifically, in process (A) shown in FIG. 2, a starting material is copper-clad laminates incorporating a substrate 22 which is made of BT (Bismaleimide-Triazine) resin and which has two sides on each of which copper foil 21 is bonded. In process (B), holes 22a serving as through holes are formed in the substrate 22 by punching, and then electroless plating is performed so that the inner surfaces of the holes 22a are applied with copper plating. Thus, through holes 24 are formed.

In process (C), etching resist (not shown) is previously applied, and then an etching process is performed to remove unnecessary portions of the copper foil 21. As a result, a predetermined conductive circuit 25 is formed.

In process (D), the surfaces of the conductive circuit 25 and the through holes 24 are subjected to blacking-reducing process so as to be coarsened.

In process (E), resin 26 which must be enclosed is uniformly applied by using a roll coater, and then the resin which must be enclosed is hardened. Then, the resin which must be enclosed is ground with a belt sander or the like until the conductive circuit 25 is exposed on the surface. As a result, a core substrate 20 having two flat surfaces is manufactured.

The core substrate 20 is brought to a state in which the inside portion of the through holes 24 and two sides 25a of the conductive circuit 25 are coarsened. As a result, the adhesiveness between the conductive circuit 25 and the resin 26 which must be enclosed can be improved. Hence it follows that occurrence of a crack can be prevented which occurs in the adhesive layer 34 described with reference to FIG. 1 and which starts at the interface between the conductive circuit 25 and the resin 26 which must be enclosed.

Figure 3:
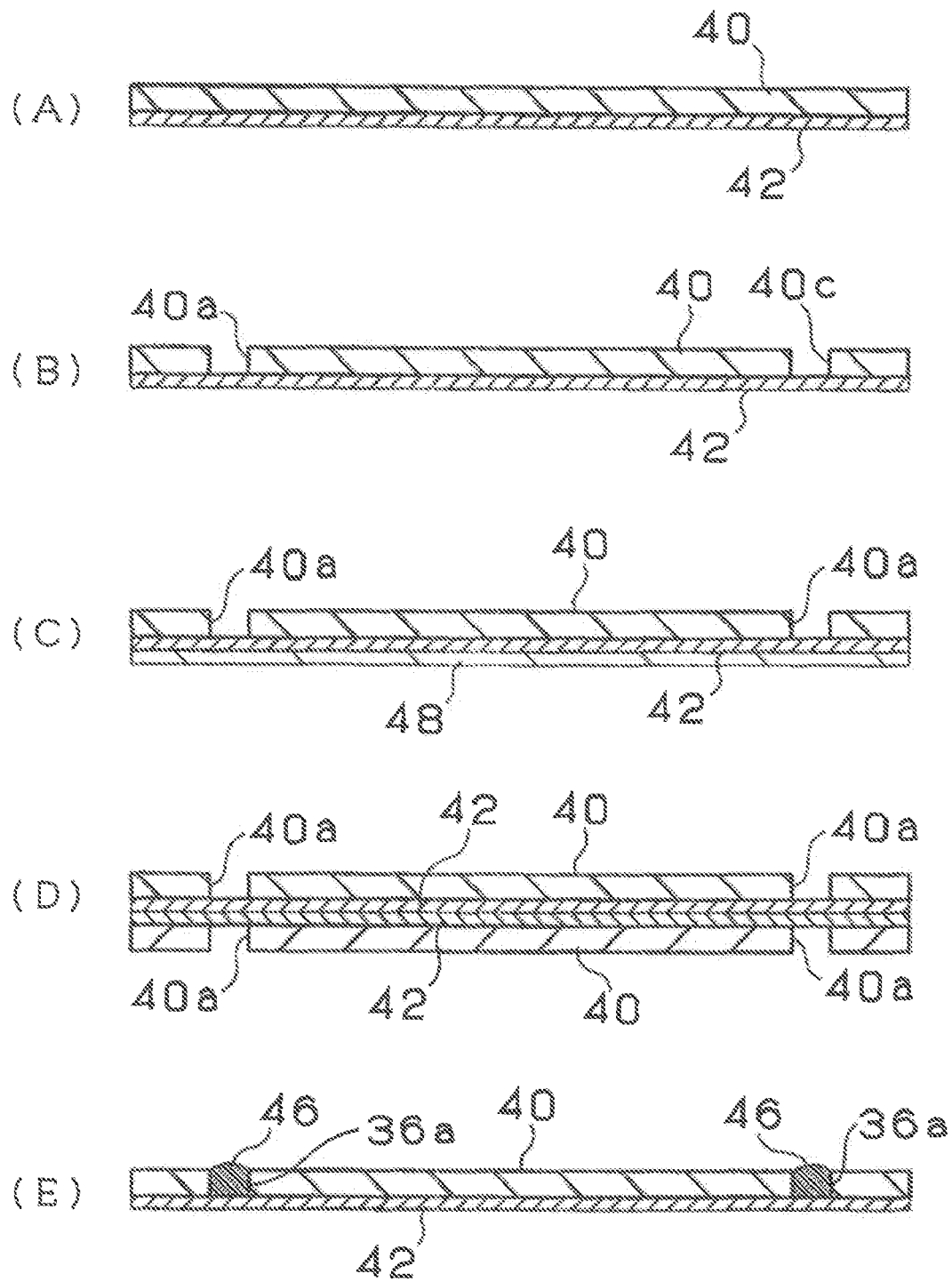
FIG. 3 is a diagram showing a process for manufacturing a single-sided circuit board which constitutes the multilayer printed circuit board according to the embodiment of the present invention.
Figure 4:
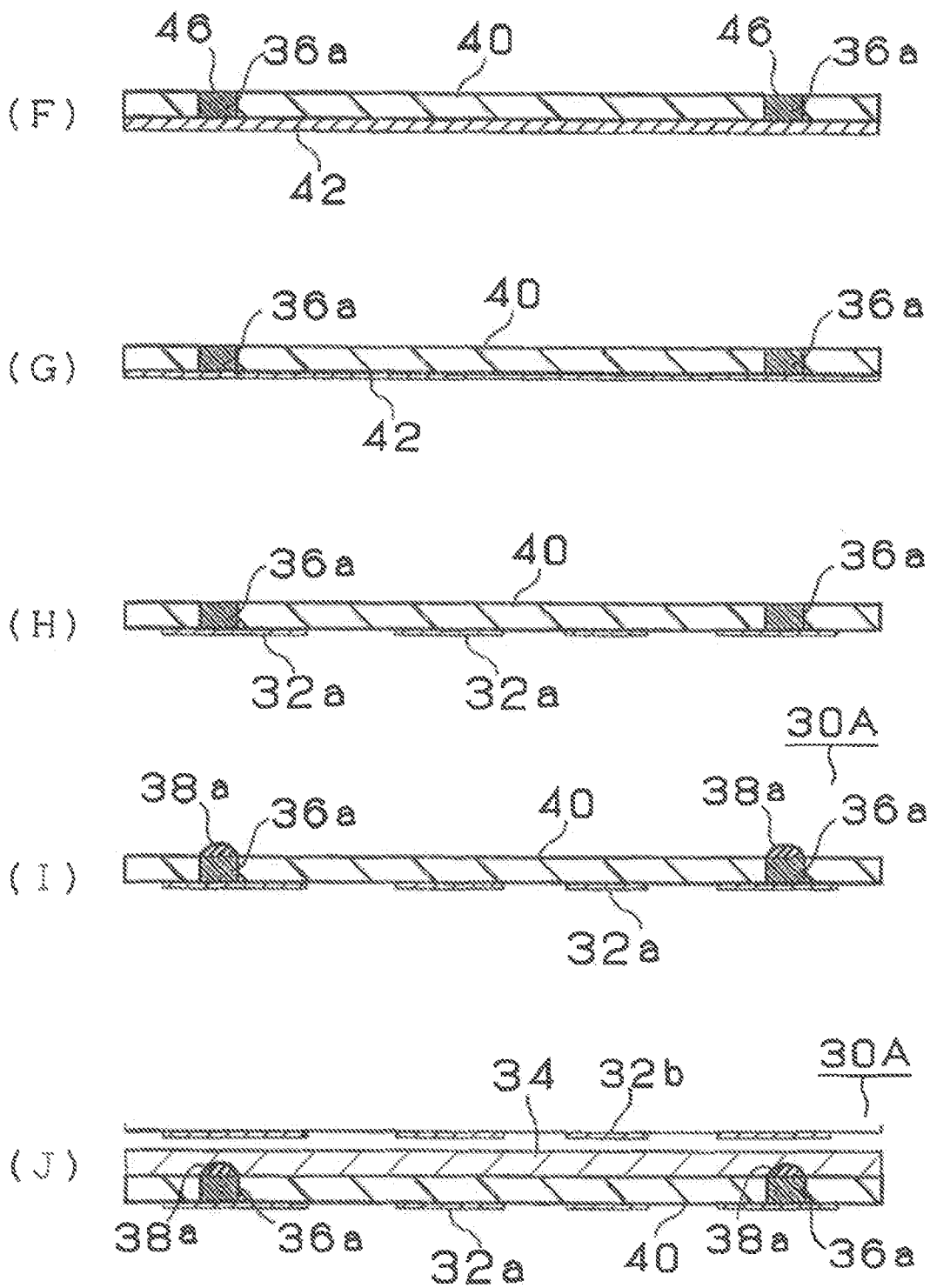
FIG. 4 is a diagram showing a process for manufacturing the single-sided circuit board which constitutes the multilayer printed circuit board according to the embodiment of the present invention.

Description of the method of manufacturing the single-sided circuit board 30 according to the present invention will now be continued with reference to FIGS. 3 and 4. In process (A) shown in FIG. 3, an insulating base member 40 having a metal layer 42 formed on either surface thereof is used as a starting material. The insulating base member 40 must be an organic insulating base member. Specifically, it is preferable that a base member is selected from rigid laminates including an aramide nonwoven fabric cloth-epoxy resin base member, a glass cloth epoxy resin base member, an aramide nonwoven fabric cloth-polyimide base member and a bismaleimide-triazine resin base member or films including a polyphenylene (PPE) film and a polyimide (PI) film.

It is preferable that the insulating base member 40 is a rigid laminated base member. In particular, it is preferable that a single-sided circuit board is employed. The reason for this lies in that displacement of the positions of the wiring pattern and the via holes can be prevented during handling which is performed after the metal layer 42 has been etched. That is, excellent accuracy of the position can be realized.

The metal layer 42 formed on the insulating base member 40 may be copper foil. The copper foil may be subjected to a matting process in order to improve the adhesiveness. The single-sided circuit board is a substrate which can be obtained by heat pressing a laminate of prepreg and copper foil, the prepreg being in the form of a B-stage constituted by causing a glass cloth to be impregnated with thermosetting resin, such as epoxy resin, phenol resin or bismaleimide-triazine resin. The single-sided circuit board is a rigid substrate which can easily be handled and which is an advantage substrate from the viewpoint of cost reduction. Metal may be evaporated on the surface of the insulating base member 40, followed by forming a metal layer by performing electrolytic plating.

The thickness of the insulating base member 40 is 10 µm to 200 µm, preferably 15 µm to 100 µm. The optimum thickness is 20 µm to 80 µm to maintain insulating characteristics. If the thickness is smaller than the above-mentioned ranges, the strength is decreased excessively to perform easy handling. If the thickness is too large, formation of small via holes is inhibited and enclosing of the conductive material cannot easily be performed.

The thickness of the metal layer 42 is 5 µm to 35 µm, preferably 8 µm to 30 µm, and more preferably 12 µm to 25 mm. If the thickness is too small, a hole attempted to be formed by a laser process as described later is undesirably formed into a through hole. If the thickness is too large, a fine pattern cannot be formed by the etching process.

Then, the laser irradiation process is performed to form non-penetrating holes 40a in the insulating base member 40 (process (B)). The laser processing machine may be a carbon dioxide gas laser processing machine, an UV laser processing machine or an excimer laser processing machine. It is preferable that the caliber of the laser processing machine is 20 µm to µm. The carbon dioxide gas laser processing machine exhibits high processing speed, enabling the cost of the process to be reduced. Therefore, the foregoing laser processing machine is a most suitable machine from a viewpoint of industrial use. Therefore, the foregoing laser processing machine is a most suitable machine for the present invention. When the carbon dioxide gas laser processing machine is employed, resin existing in the non-penetrating hole 40a and slightly melted onto the surface of the metal layer 42 is easily left. Therefore, it is preferable that a desmear process is performed to maintain the reliability of the connection.

Then, an electrolytic plating is enclosed in the non-penetrating holes 40a formed by the laser process so that via holes 36a are formed (process (E)). As an alternative to this, conductive paste may be enclosed or a portion of electrolytic plating may be enclosed, followed by enclosing conductive paste into a residual portion. The electrolytic plating may be, for example, copper, gold, nickel or solder plating. Most suitable electrolytic plating is copper electrolytic plating. In this case, the formation of the bumps can be performed simultaneously with the process.

The conductive paste may be conductive paste made of metal particles made of one or more materials selected from silver, copper, gold, nickel and solder. As the metal particles, a material may be employed which is obtained by coating the surfaces of the metal particles with different metal. Specifically, metal particles may be employed which are obtained by coating the surfaces of copper particles with noble metal selected from gold and silver.

It is preferable that the conductive paste is organic conductive paste obtained by adding thermosetting resin, such as epoxy resin, phenol resin or polyphenylene sulfide (PPS), to the metal particles.

In this embodiment, the small holes each having a diameter of 20 µm to 150 µm are formed by the laser process and enclose the electrolytic plating, which is an advantage since air bubbles easily release compared with the enclosure of the conductive paste.

The electrolytic plating is performed as the lead for the metal layer 42 formed on the insulating base member 40. Since the metal layer 42 is formed on the overall surface of the insulating base member 40, the density of the electric field can be uniform. In this embodiment, the non-penetrating holes are completely enclosed by electrolytic plating. Therefore, the non-penetrating holes can be enclosed with the electrolytic plating such that a uniform height is realized. It is preferable that the surface of the metal layer 42 in each of the non-penetrating holes 40a is subjected to an activating process using acid or the like. When plating is performed, it is preferable that deposition of the electrolytic plating on the surface of the metal layer 42 provided for the organic insulating base member 40 is prevented by applying a mask 48 on the metal layer 42 in process (C). As an alternative to this, in process (D), two insulating base members 40 are laminated and brought into hermetic contact with each other to prevent contact with the plating solution during the electrolytic plating process.

After the electrolytic plating has been completed, a portion of the electrolytic plating (metal 46) projecting over the non-penetrating holes 40a may be removed by grinding or the like to flatten the surface in process (F) shown in FIG. 4. The grinding process may be performed by using a belt sander or by buffing.

In process (G), a process which is performed before the metal layer 42 is etched to form the conductive circuit and which is a process for easily forming a fine pattern is carried out with which the non-penetrating holes are previously formed by a laser process, followed by etching the overall surface of the metal layer 42 to reduce the thickness to about 1 μm to about 10 μm, preferably about 2 μm to about 8 μm.

As shown in process (H), a mask having a predetermined pattern is applied, and then the metal layer 42 is etched to form the conductive circuit 32a. Initially, a photosensitive dry film is applied or liquid-type photosensitive resist coat is applied. Then, exposure and development are performed to conform to the predetermined circuit pattern so that an etching resist is formed. Then, the metal layer in the portions in which the etching resist is not formed is etched so that a conductor pattern is formed. It is preferable that the etching is performed by using solution of at least one type of material selected from sulfuric acid-hydrogen peroxide, persulfate, cupric chloride and ferric chloride.

Note that the uppermost pattern may be formed by etching the metal layer after the laminate pressing process has been completed. When the metal layer is etched after the laminate pressing process has been completed, an advantage can be realized in that heat pressing can be performed with uniform pressure because the surfaces which must be pressed are flat surfaces.

It is preferable that the surface of the conductive circuit 32a is subjected to a coarsening process. The reason for this lies in that the adhesiveness with the adhesive layer 34 described with reference to FIG. 1 can be improved in the foregoing case to prevent separation (delamination). The coarsening process may be, for example, a soft etching process, a blackening (oxidizing) reducing process, formation of needle-shape alloy plating ("INTERPLATE" which is trade name of Ebara) of copper-nickel-phosphorus or surface coarsening process using etching solution "MECH ETCHBOND" which is trade name of Mech.

In process (I), bumps 38a are formed on the surfaces of the via holes 36a opposite to the surface on which the conductive circuit 32a has been formed. The bumps 38a can be formed by, for example, a method with which conductive paste is screen-printed by using a metal mask having openings formed at predetermined positions, a method with which paste of solder which is metal having a low melting point is printed, a method with which solder plating is performed or a method with which immersion in solution in which solder has been melted is performed.

The metal having the low melting point may be Pb—Sn type solder, Ag—Sn type solder or indium solder.

It is preferable that the height of each bump from the insulating 30 base member 40 is 3 μm to 60 μm. If the height is smaller than 3 μm, absorption of dispersion of the heights of the bumps by virtue of deformation of the bumps cannot be realized. If the height is larger than 60 μm, the resistance value is raised excessively. To a worse extent, the bumps are expanded in the lateral direction when the bumps 35 have been deformed, causing short circuit to occur.

In the foregoing state or before the bumps are formed, inspections of the conductive circuit 32a and the via holes 36a can be performed. The conventional multilayer printed circuit board permits the inspection of the conductive circuit to be performed only after lamination has been performed, that is, after completion. As compared with this, whether or not the single-sided circuit board 30A has a defect can be inspected before the laminating operation. Since only single-sided circuit board 30A free from any defect can be used in a laminating process to be described later, a satisfactory high yield of the multilayer printed circuit board can be obtained.

The single-sided circuit board of the present invention laminates plural single-sided circuit boards to each other or is laminated to the core substrate 20 shown in FIG. 2. The adhesive in this case, for example, shown in the process (J), coats the overall surface of the insulating base member 40 adjacent to the bumps 38a with resin. Then, the resin is dried so that an adhesive layer 34 constituted by non-hardened resin is formed.

The adhesive layer 34 may be formed by coating the overall surface of the single-sided circuit board on which the conductive circuit has been formed, the overall opposite surface or the overall surface of substrate 20 on which the conductive circuit 25b has been formed, the substrate 20 being a substrate having a conductive circuit. Therefore, a necessity for forming holes for establishing conduction in the adhesive layer can be eliminated.

It is preferable that the adhesive layer 34 is made of organic adhesive agent. It is preferable that the organic adhesive agent is a resin selected from epoxy resin, polyimide resin, thermosetting polyphenylene ether (PPE), composite resin of the epoxy resin and the thermosetting resin, composite resin of epoxy resin and silicon resin or BT resin.

The non-hardened resin which is the organic adhesive agent can be applied by using a curtain coater, a spin coater, a roll coater or a spray coater or by screen printing. Also the formation of the adhesive layer can be performed by laminating an adhesive sheet. It is preferable that the thickness of the adhesive layer is 5 μm to 50 μm. To facilitate handling, it is preferable that the adhesive layer is pre-cured.

Figure 5:
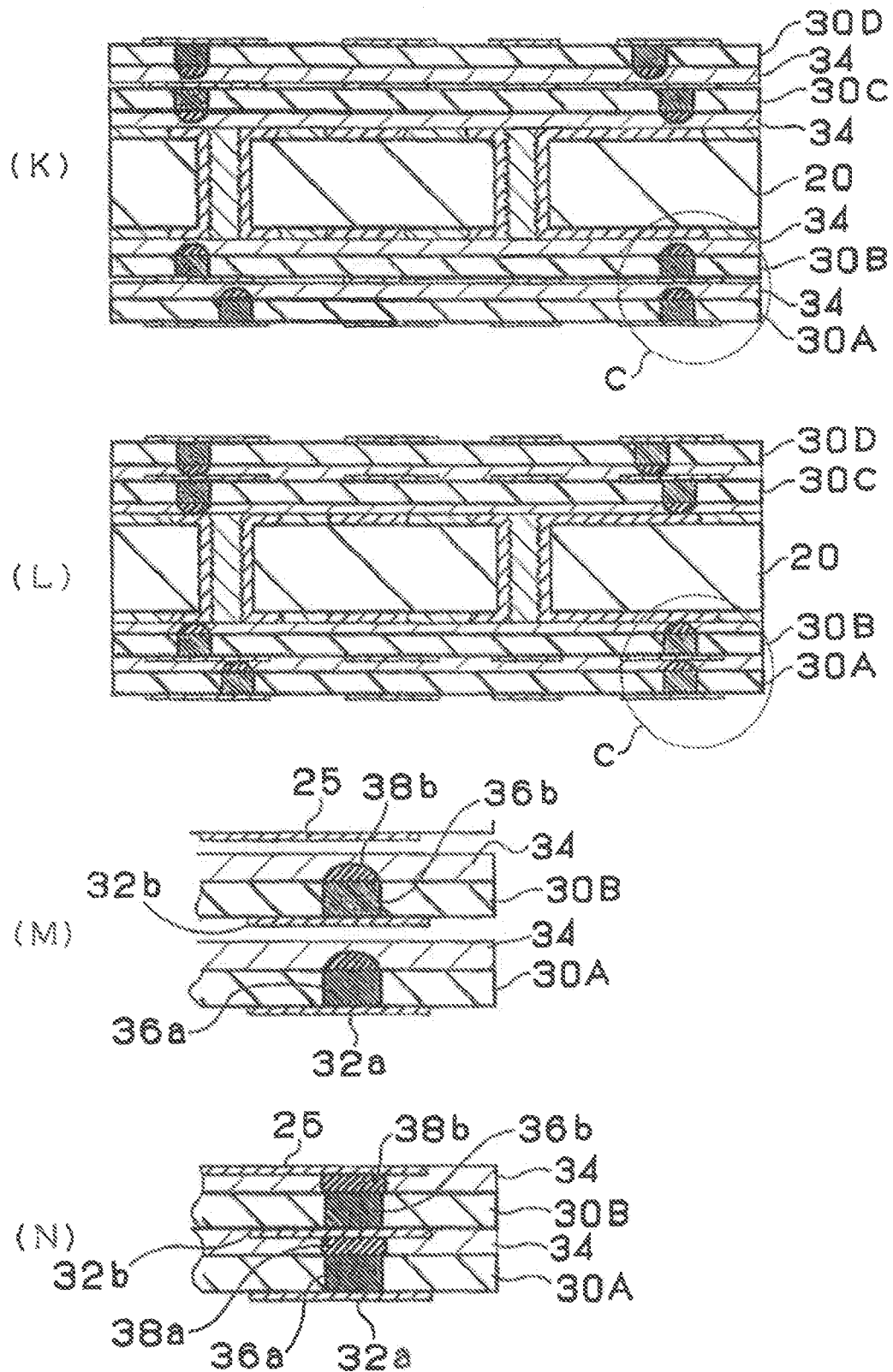
FIG. 5 is a diagram showing a process for manufacturing the multilayer printed circuit board according to the embodiment of the present invention.
Figure 6:
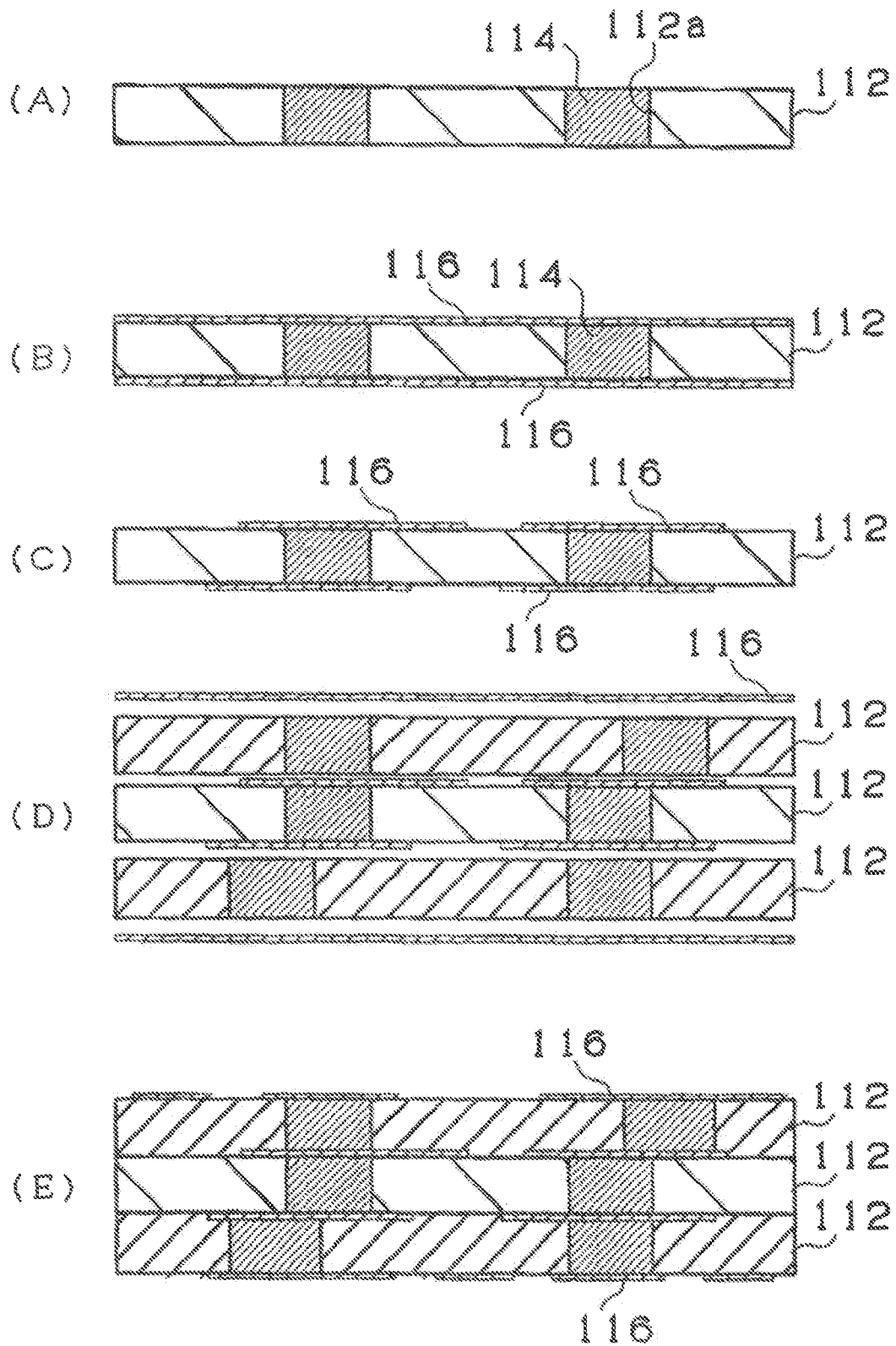
FIG. 6 is a diagram showing a process for manufacturing a conventional multilayer printed circuit board.

The process of laminating the core substrate 20 described with reference to FIG. 2 and the single-sided circuit board 30 described with reference to FIGS. 3 and 4 will continuously be described with reference to FIG. 5.

In process (K), the single-sided circuit board 30A, the single-sided circuit board 30B, 30C and 30D formed by a process similar to the above-mentioned process and the core substrate 20 are laminated. All of the single-sided circuit boards 30A, 30B, 30C and 30D and the core substrate 20 must be substrates subjected to inspection for a defective portion. Initially, the single-sided circuit board 30B is placed on the organic adhesive layer 34 of the single-sided circuit board 30A, while the core substrate 20 is placed on the organic adhesive layer 34 of the single-sided circuit board 30B. The foregoing substrates are laminated on the core substrate in such a manner that the single-sided circuit boards 30C and 30D are inverted, that is, the organic adhesive layer 34 of the single-sided circuit board 30C faces the core substrate 20. Moreover, the organic adhesive layer 34 of the single-sided circuit board 30D faces the single-sided circuit board 30C. The lamination is performed while position alignment is being performed by inserting a guide pin (not shown) into a guide hole (not shown) formed around the single-sided circuit board 30 and the core substrate 20. A portion of circle C of the laminated substrate shown in the drawing is indicated by enlarging the same in (M). The position alignment may be performed by an image process.

Finally, in process (L), the laminated substrates are heated to 150° C. to 200° C. by using a heating press and applied with pressure of 5 kgf/cm$^2$ to 100 kgf/cm$^2$, preferably 20 kgf/cm$^2$ to 50 kgf/cm$^2$. Thus, the single-sided circuit boards 30A, 30B, 30C and 30D and the core substrate 20 are integrated into a multilayer structure by one press molding operation. A portion of circle C of the laminated substrates shown in the drawing is shown in (N). Since the pressure is applied, the bump 38a of the single-sided circuit board 30A squeezes out the non-hardened resin (the insulating resin) existing between the bump 38a and the conductive circuit 32b adjacent to the single-sided circuit board 30B. Thus, the bump 38a is brought into contact with the conductive circuit 32b so that the connection between the bump 38a and the conductive circuit 32b is established. Similarly, the bumps 38b, 38c and 38d of the single-sided circuit board 30B, 30C and 30D and the conductive circuit are connected to one another. Since also heat is applied simultaneously with exertion of the pressure, the adhesive layer 34 of the single-sided circuit board 30A is hardened so that strong adhesion is realized with the single-sided circuit board 30B. It is preferable that the heating press is vacuum heating press. As a result, the multilayer printed circuit board 10 described with reference to FIG. 1 can be manufactured.

Another embodiment will now be described with reference to FIG. 7.

Figure 7:
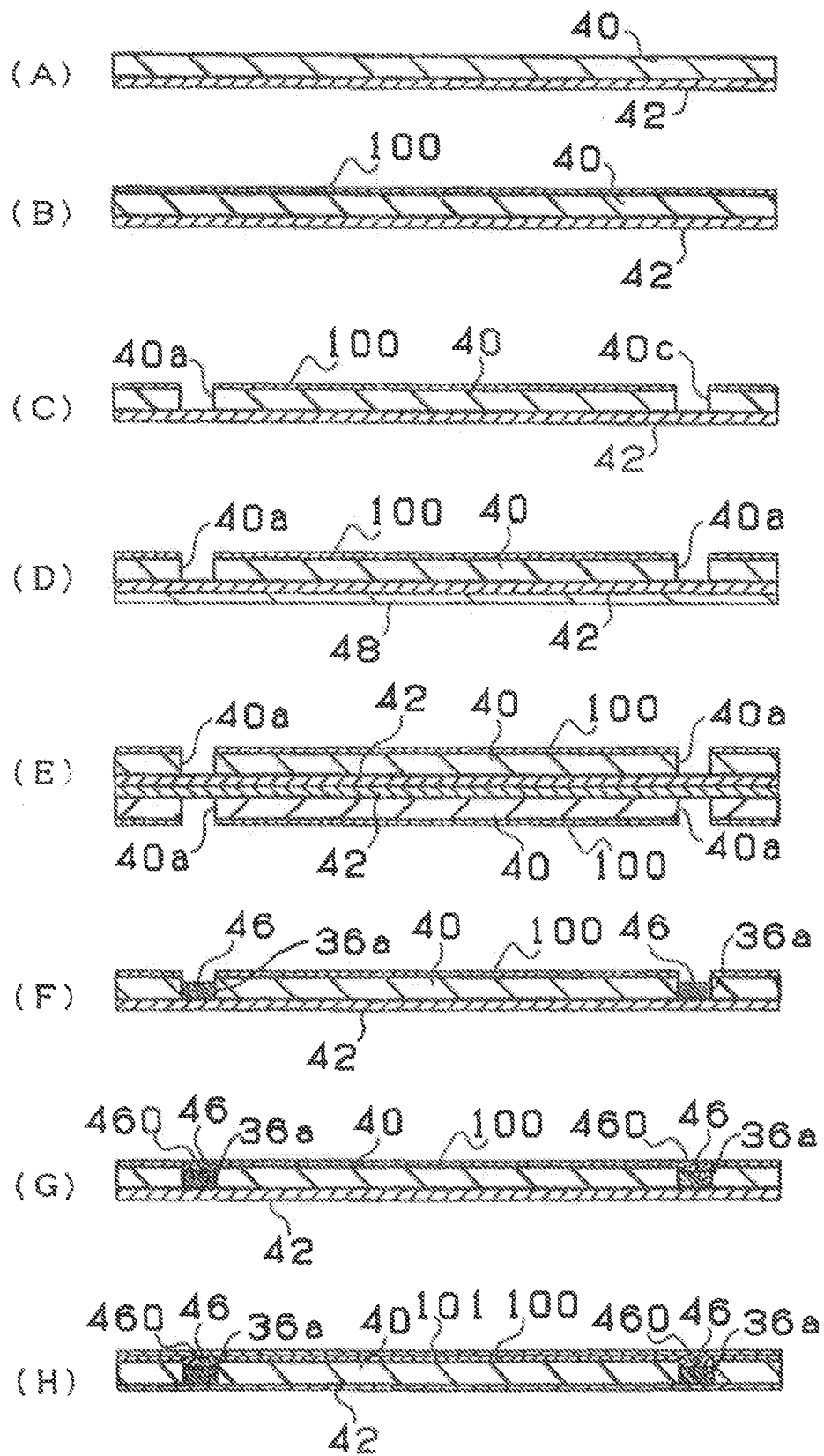
FIG. 7 is a diagram showing a process for manufacturing the core substrate which constitutes the multilayer printed circuit board according to the embodiment of the present invention.

In process (B), a protective film 100 which is usually used as a mask serving in a process for printing conductive paste is bonded to a single-sided copper clad laminate 40 which has been prepared in process (A) shown in FIG. 7. In process (C), an operation for laser-processing the single-sided copper-clad laminate 40 is performed so that non-penetrating holes are formed. For the protective film 100, for example, a polyethylene terephthalate film (PET) having an adhesive layer formed on the surface thereof may be employed. Deposition of plating onto the metal layer 42 must be prevented by bonding a mask 48 in process (D). As an alternative to this, the metal layers 42 are brought into hermetic contact with each other in process (E) to prevent contact with the electrolytic plating solution. In process (F) a portion of the non-penetrating holes is filled with electrolytic plating 46. In process (G) conductive paste 460 is enclosed in residual spaces. In the foregoing embodiment, dispersion of the heights of the electrolytic plating can be corrected by using conductive paste 460 so that the heights of the bumps are uniform. As an alternative to the foregoing conductive paste, the metal having the low melting point can be enclosed.

Figure 8:
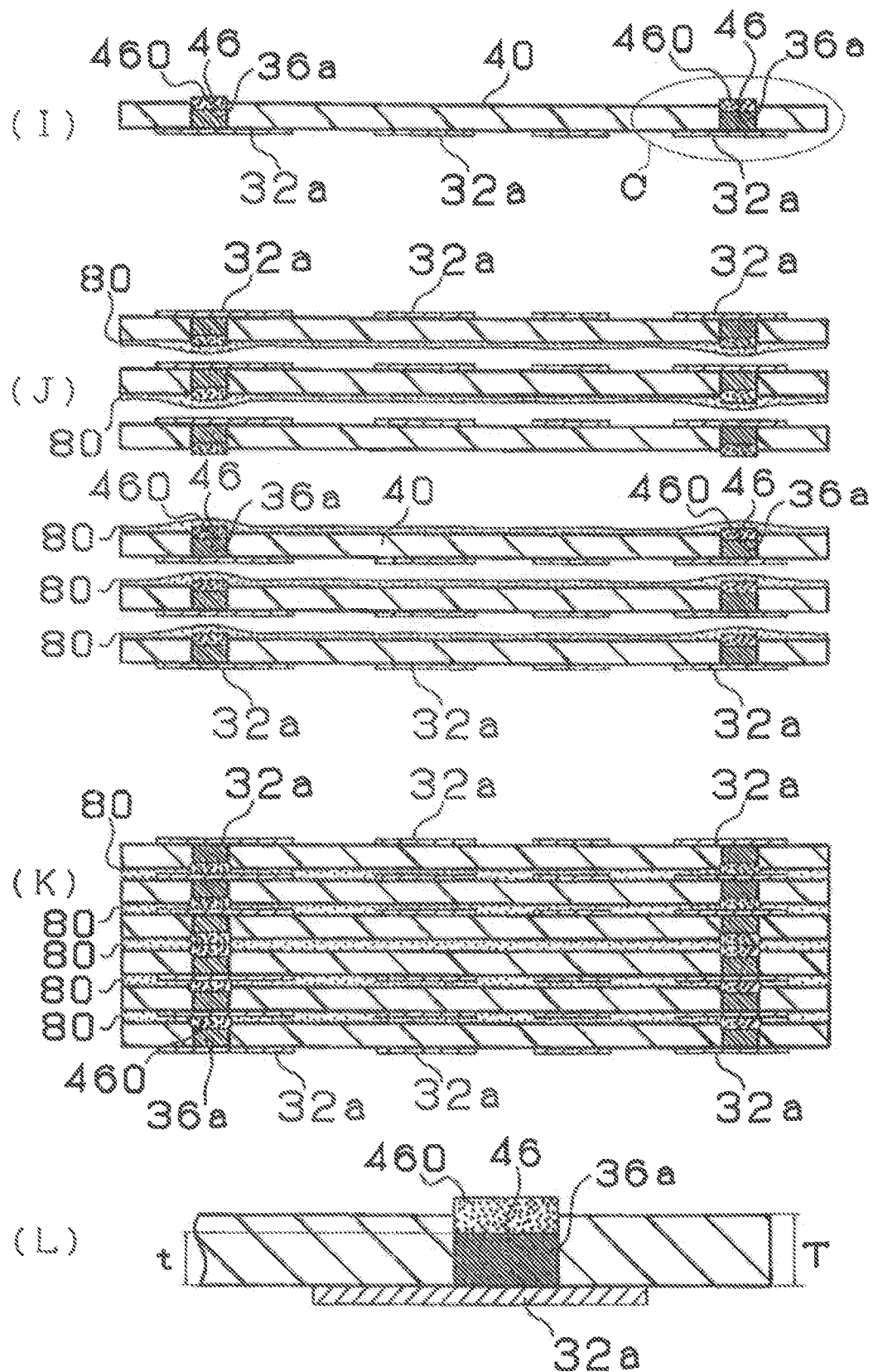
FIG. 8 is a diagram showing a process for manufacturing the core substrate which constitutes the multilayer printed circuit board according to the embodiment of the present invention.

An average charging rate of the electrolytic plating in the non-penetrating holes (heights t of electrolytic plating×100/depth T of the non-penetrating holes: refer to FIG. 8(L).) is not lower than 50% nor lower than 100%, preferably 55% to 95%, more preferably 60% to 90%.

The conductive paste 460 enclosed in the opening portions of the protective film 100 is formed into bumps. In process (H) a film 101 for protecting the conductive paste 460 is bonded. Then, the metal layer 42 is etched so that a conductive circuit is formed. Then, in the process (I) the film 101 is removed to expose the bumps formed by the conductive paste 460 so that a single-sided circuit board 30E of the present invention is obtained.

It is preferable that the bumps made of the conductive paste is in a semi-hardened state. Since the conductive paste is hard if it is in the semi-hardened state, the conductive paste is able to penetrate the organic adhesive layer softened during the heat pressing process.

Figure 9:
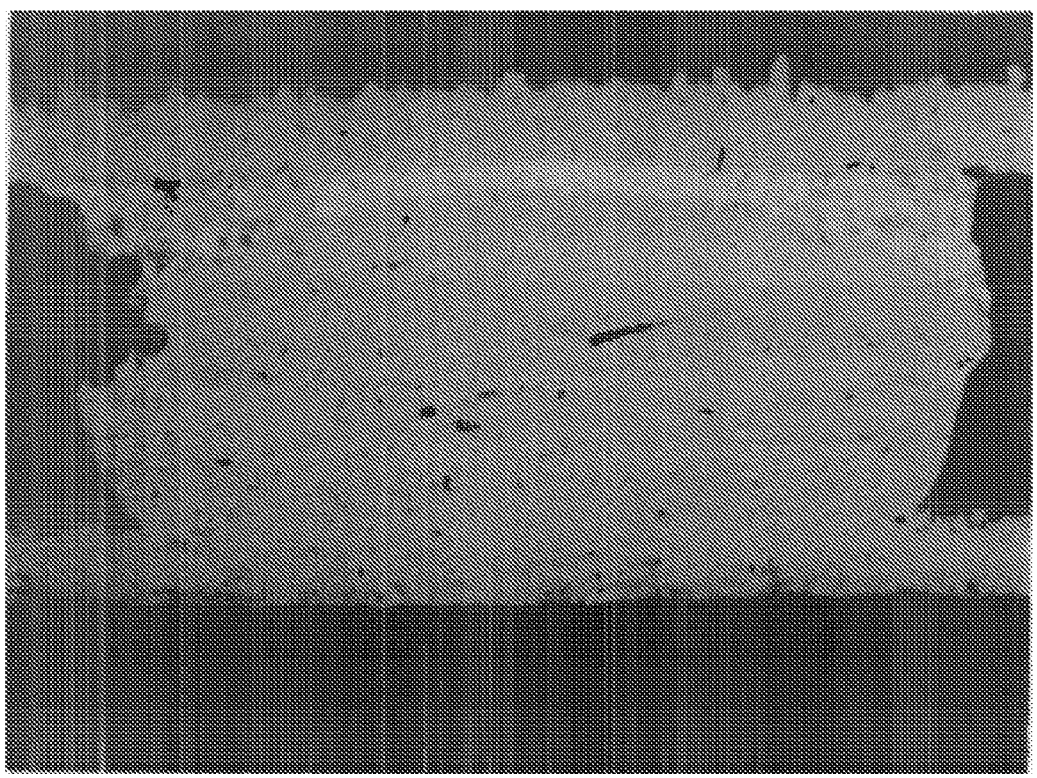
FIG. 9 is an enlarged photograph showing a metal structure of the cross section of a via hole in the multilayer printed circuit board according to the embodiment of the present invention.

When the pressing process is performed, the conductive paste is deformed, causing the area of contact to be enlarged. As a result, the conduction resistance can be lowered and dispersion of the heights of the bumps can be corrected. FIG. 9 shows an enlarged photograph of the structures of the via hole and the bump portion.

Then, the single-sided circuit substrate 30E obtained by performing steps (A) to (I) are laminated in process (J) so that three layers for each side are placed opposite to each other through the adhesive layers 80. The lamination is performed while position alignment is being performed by inserting a guide pin (not shown) into a guide hole (not shown) formed in the peripheries of the single-sided circuit board 30 and the core substrate 20. The position alignment may be performed by performing an image process.

Then, the multilayer printed circuit board 10 structured in process (K) may be manufactured by performing heat pressing.

In the foregoing embodiment, the multilayer printed circuit boards have four laminated single-sided circuit boards 30 and six laminated single-sided circuit boards 30, respectively. The single-sided circuit board according to the present invention may be applied to a multilayer printed circuit board having three layers or five or more layers. The single-sided circuit boards according to the present invention may be laminated on a single-sided printed circuit board, a double-sided printed circuit board, a double-sided through-hole printed circuit board or a multilayer printed circuit board to manufacture a multilayer printed circuit board.

Although the foregoing embodiment has the structure that the holes for forming the via holes are formed by the laser process, the holes may be formed by a mechanical method, such as drilling, punching or the like.

The multilayer printed circuit board manufactured by the single-sided circuit board according to the present invention may be subjected to a variety of usual processes to which the printed circuit board has been subjected. For example, formation of solder resist on the surface, nickel/gold plating, soldering, hole formation, a cavity forming process and plating of through holes may be performed.

As described above, the multilayer printed circuit board and a manufacturing method therefor according to the present invention are arranged such that the single-sided circuit boards each having a conductive circuit which incorporates a predetermined wiring pattern formed thereon are previously and individually manufactured. Therefore, inspection for detecting whether or not the conductive circuit or the like has a defective portion can be performed before the single-sided circuit boards are laminated. Hence it follows that only single-sided circuit boards free from any defect can be used in the laminating process. That is, the manufacturing method according to the present invention is able to reduce defects in the manufacturing process. As a result, the multilayer printed circuit board having the IVH structure can be manufactured with a high manufacturing yield by the single-sided circuit board according to the present invention.

Also, it is not required by single-sided circuit board according to the present invention to repeat the heating press operation while the prepreg is being laminated as distinct from the conventional technique. That is, the present invention enables heat pressing operation to be completed at a time such that a plurality of the single-sided circuit boards are laminated through the adhesive agents placed on the single-sided circuit boards. Therefore, it is free from a necessity for repeating the laminating process in which the complicated heat press is performed and the patterning process. Hence it follows that the multilayer printed circuit board having the IVH structure can efficiently be manufactured. Since the single-sided circuit boards are integrated with physical force exerted at the time of the pressing operation, the reliability of the connection can be improved.

Furthermore, in the present invention, in order to manufacture the single-sided circuit board, formation of the non-penetrating hole in the organic insulating base member is performed by the laser process. The previous formation of the conducting hole in the organic adhesive layer is not required. The necessity for simultaneously forming holes in the insulating base member and the adhesive layer by the laser process can be eliminated. That is, after the holes have been formed in the insulating base member by the laser process, the adhesive layer can be formed on the single-sided circuit board or the substrate having the conductive circuit. Therefore, the desmear process, which is performed after the holes have been formed can be performed before the adhesive layer is formed. As a result, the desmear process does not erode the organic adhesive layer.

Also in a case where the non-penetrating hole is filled with the electrolytic plating, the adhesive layer can be formed on the single-sided circuit board or the substrate having the conductive circuit after the non-penetrating hole has been formed in the insulating base member by performing the laser process and the non-penetrating hole has been filled with the electrolytic plating. Therefore, the electrolytic plating solution and the adhesive layer are not made contact with each other. As a result, the erosion of the adhesive layer with the plating solution can be prevented.

Since the adhesive layer is not hardened until the heat pressing process which is the final process is performed, the adhesive layer easily deteriorates during the desmear process or the plating solution. The present invention has characteristics that the above-mentioned problem can be prevented and a reliable substrate can be easily formed.

Furthermore, in the single-sided board of the present invention, the via holes are formed by enclosing the electrolytic plating in the non-penetrating holes of the insulating base member. The projecting conductors made of the conductive paste or the metal having a low melting point are formed on the surfaces of the via holes formed on the surface of said insulating base member opposite to the surface on which conductive circuit has been formed. Therefore, since the conductive paste or the metal having a low melting point is deformed during the heat pressing and absorption of dispersion of the heights of the electrolytic plating can be realized, the multilayer printed circuit board which the defective connection can be prevented and is highly reliable in connection is obtained.

Moreover, a necessity for previously forming a conducting hole in the adhesive layer can be eliminated according to the present invention. Therefore, defective conduction caused from deviation in the positions of the hole in the adhesive layer and the projecting conductors provided for the organic insulating base member can be prevented.

In the present invention, the projecting conductors comprised the conductive paste or metal having a low melting point are formed on the via holes filled with the electrolytic plating. Therefore, the electrical connection between the upper and lower conductive layers can be easily established by penetrating the relatively thin organic adhesive layer on the multilayer printed wiring board. Therefore, the height and the diameter of each projecting conductor can be reduced. Hence it follows that the pitch between adjacent projecting conductors can be shortened. Therefore, the pitch between adjacent via holes can also be shortened. As a result, addressing to the raising of the density can be permitted.

What is claimed is:

1. A method of manufacturing a single-sided circuit substrate, comprising:
    providing a rigid insulating base member having a metal layer on a first surface of said rigid insulating base member and comprising one of an aramide nonwoven fabric cloth-epoxy resin, a glass cloth epoxy resin, an aramide nonwoven fabric cloth-polyimide, and a prepreg in a form of a B-stage, the prepreg comprising a glass cloth impregnated with phenol resin or bismaleimide-triazine resin;
    forming non-penetrating holes which reach said metal layer by a laser process in said rigid insulating base member;
    forming via holes comprising copper electrolytic plating in said non-penetrating holes such that said copper electrolytic plating of said via holes does not project over said non-penetrating holes;
    forming a conductive circuit by etching said metal layer; and
    forming projecting conductor portions projecting beyond a second surface of said rigid insulating base member on an opposite side of the first surface, said projecting conductor portions formed at said via holes, respectively, and comprising conductive paste or a metal material having a low melting point.

2. A method of manufacturing a single-sided circuit substrate according to claim 1, wherein said etching of said metal layer is performed subsequent to said forming of said projecting conductor portions.

3. A method of manufacturing a single-sided circuit substrate according to claim 1, further comprising coarsening a surface of said conductive circuit.

4. A method of manufacturing a single-sided circuit substrate according to claim 2, further comprising coarsening a surface of said conductive circuit.

5. A method of manufacturing a single-sided circuit substrate according to claim 1, wherein said metal layer comprises a copper foil laminated to the first surface of said rigid insulating base member.

6. A method of manufacturing a single-sided circuit substrate according to claim 2, wherein said metal layer comprises a copper foil laminated to the first surface of said rigid insulating base member.

7. A method of manufacturing a single-sided circuit substrate according to claim 1, wherein said rigid insulating base member comprises said prepreg and said metal layer comprises a copper foil laminated to the first surface of said rigid insulating base member by heat-pressing.

8. A method of manufacturing a single-sided circuit substrate according to claim 2, wherein said rigid insulating base member comprises said prepreg and said metal layer comprises a copper foil laminated to the first surface of said rigid insulating base member by heat-pressing.

9. A method of manufacturing a single-sided circuit substrate according to claim 1, wherein said forming of via holes comprises removing a portion of said copper electrolytic plating projecting over said non-penetrating holes to flatten surfaces of said via holes.

10. A method of manufacturing a single-sided circuit substrate according to claim 9, wherein said removing comprises grinding said portion of said copper electrolytic plating projecting over said non-penetrating holes.

11. A method of manufacturing a single-sided circuit substrate according to claim 10, wherein said grinding is performed by a belt sander.

12. A method of manufacturing a single-sided circuit substrate according to claim 10, wherein said grinding is performed by buffering.

13. A method of manufacturing a single-sided circuit substrate according to claim 1, wherein said forming of via holes comprises filling said non-penetrating holes with said copper electrolytic plating to an average depth of 50% or higher of a depth of said non-penetrating holes and lower than 100% of said depth of said non-penetrating holes.

* * * * *